United States Patent [19]

Hsieh et al.

[11] Patent Number: 5,315,151

[45] Date of Patent: May 24, 1994

[54] TRANSISTOR STRUCTURE UTILIZING A DEPOSITED EPITAXIAL BASE REGION

[75] Inventors: Chang-Ming Hsieh; Louis L. Hsu, both of Fishkill; Victor J. Silvestri, Hopewell Junction, all of N.Y.

[73] Assignee: International Business Machines Corporation, Armonk, N.Y.

[21] Appl. No.: 20,896

[22] Filed: Feb. 22, 1993

Related U.S. Application Data

[63] Continuation of Ser. No. 716,036, Jun. 14, 1991, abandoned.

[51] Int. Cl.[5] .................. H01L 29/72; H01L 29/161
[52] U.S. Cl. .................... 257/592; 257/554; 257/559; 257/197
[58] Field of Search ............. 357/34, 34 HB, 35, 43; 257/592, 554, 559, 197, 198

[56] References Cited

U.S. PATENT DOCUMENTS

| | | | |
|---|---|---|---|
| 3,962,717 | 6/1976 | O'Brien | 357/44 |
| 4,127,860 | 11/1978 | Beelitz et al. | 357/15 |
| 4,210,925 | 7/1980 | Morcom et al. | 357/46 |
| 4,255,209 | 3/1981 | Morcom et al. | 257/574 |
| 4,326,212 | 4/1982 | Bergeron et al. | 357/46 |
| 4,504,332 | 3/1985 | Shinada | 257/592 |
| 4,546,539 | 10/1985 | Beasom | 29/577 C |
| 4,654,960 | 4/1987 | McLevige et al. | 29/576 B |
| 4,843,033 | 6/1989 | Plumton et al. | 357/35 |
| 4,881,111 | 11/1989 | Sanders et al. | 357/34 |
| 4,888,306 | 12/1989 | Komatsu et al. | 437/162 |
| 4,896,203 | 1/1990 | Kajikawa | 257/197 |
| 4,901,121 | 2/1990 | Gibson et al. | 357/15 |
| 4,903,104 | 2/1990 | Kawai et al. | 357/35 |
| 4,935,797 | 6/1990 | Jambotkar | 257/197 |
| 4,939,562 | 7/1990 | Adlerstein | 357/34 |
| 4,956,689 | 9/1990 | Yuan et al. | 357/34 |
| 4,974,045 | 11/1990 | Okita | 357/34 |
| 5,017,990 | 5/1991 | Chen et al. | 257/592 |
| 5,096,844 | 3/1992 | König et al. | 357/34 |

FOREIGN PATENT DOCUMENTS

| | | | |
|---|---|---|---|
| 0321074 | 6/1989 | European Pat. Off. | 357/34 HB |
| 60-21558 | 2/1985 | Japan | |
| 63-107066 | 5/1988 | Japan | 257/198 |
| 1179454 | 7/1989 | Japan | 357/34 HB |

OTHER PUBLICATIONS

Meyerson, B., "Low Temperature Silicon Epitaxy by Ultra-high Vacuum/Chemical Vapor Deposition," Appl. Phys. Lett. 48(12) Mar. 24, 1986, pp. 797-799.

Van Ommen et al., "Synthesis of Heteroepitaxial Si/-CoSi2/Si Structures by Co Implantation Into Si," Appl. Phys. Lett., 53(8), Aug. 1988, p. 669.

Kuo, J. B., et al., "Two-Dimensional Transient Analysis of a Collector-UP ECL Inverter," IEEE Transactions on Computer-Aided Design, vol. 8, No. 10, Oct. 1989, pp. 1038-1049.

*Primary Examiner*—Rolf Hille
*Assistant Examiner*—Mahshid Saadat
*Attorney, Agent, or Firm*—Harold Huberfeld; Jeffrey L. Brandt

[57] ABSTRACT

A method of fabricating a semiconductor structure, comprising the steps of: providing a monocrystalline semiconductor device region of a first conductivity type; forming a layer of intrinsic monocrystalline semiconductor material over the device region; forming a layer of insulating material over the layer of intrinsic monocrystalline semiconductor material; forming a conductive contact over a portion of the layer of insulating material; forming an aperture extending through the conductive contact, and the layers of insulating material and intrinsic monocrystalline semiconductor material to define an aperture exposing a selected portion of the layer of intrinsic monocrystalline semiconductor material; and forming a layer of semiconductor material of a second conductivity type including a monocrystalline portion disposed epitaxially over the device region portion and a polycrystalline portion extending onto the wall of the conductive contact within the aperture.

9 Claims, 9 Drawing Sheets

TRANSISTOR STRUCTURE UTILIZING A DEPOSITED EPITAXIAL BASE REGION

CROSS REFERENCE TO RELATED APPLICATIONS

This application is a continuation, now abandoned, of application Ser. No. 07/716,036, filed Jun. 14, 1991, now abandoned.

The present application is related to U.S. applications Ser. No. 07/309,510, filed Feb. 13, 1989, by Harame et al., Ser. No. 07/602,822, filed Oct. 24, 1990 by Desilets et al., and Ser. No. 07/405,508, filed Sep. 11, 1989 by Rosenberg et al.

FIELD OF THE INVENTION

The present invention relates generally to semiconductor devices and processes, and more particularly to a transistor structure including a deposited epitaxial base region, and a method for making same. The structure is particularly adaptable to provide a buried-emitter bipolar transistor, or a buried-emitter, Schottky Barrier Collector Transistor (SBCT).

BACKGROUND OF THE INVENTION

In the fabrication of vertical, high performance bipolar transistors, it is generally desirable to provide very shallow intrinsic base regions. Such shallow intrinsic base regions, preferably in the sub-micron dimension range, permit the fabrication of high-frequency transistors: i.e. having speeds in the gigahertz range.

The formation of the intrinsic base region in the transistors described above is typically accomplished by diffusion from a gaseous or solid diffusion source, or by ion implantation (I/I). Diffusion tends to be difficult to control, and may result in undesirably thick base regions. Ion implantation, while more controllable than diffusion, also has inherent limitations, for example implant damage and channeling effects. Particularly with respect to ion implantation of boron atoms, the thickness of the implanted region is limited by secondary channeling effects. Further, both diffusion and ion implantation are particularly difficult to utilize with transistors having shallow, heterojunction base regions: i.e. silicon-germanium (SiGe) base regions.

In U.S. Pat. No. 4,504,332 to Shinada, a layer of silicon is epitaxially deposited over a partially insulated substrate, so as to be single crystal in structure where it contacts the substrate, and polycrystalline in structure where it contacts the insulator. The base region is deposited into the single crystal region of the layer by ion implantation, while the emitter region is deposited into the base region by outdiffusion from a solid doping source. There is thus completed a bipolar transistor. Shinada, however, shows a relatively thick deposited layer, with relatively thick and uncontrolled base and emitter regions. The teachings of Shinada could not readily be used to provide narrow base, high-performance bipolar transistors of the type typically in use today.

A process of low temperature, ultra-high vacuum, chemical vapor deposition is known in the art for forming thin, discretely doped layers of epitaxial silicon (or heterojunction material such as SiGe). See Meyerson, B., "Low Temperature Silicon Epitaxy by Ultra-high Vacuum/Chemical Vapor Deposition," Appl. Phys. Lett. 48(12), 24 March 1986, pgs. 797–799. This process, also known as low temperature epitaxy (LTE), has been used to form various device regions, including, in certain limited configurations, the base regions of transistors. The process is advantageous for these purposes in that it provides relatively defect-free, thin layers. This same thinness of the layers, however, makes it difficult to provide high-yield, defect-free devices and structures. Such thin layers are prone to the propogation of dislocation defects, this propogation caused by high temperature processes, such as annealing. Heterogeneous layers of SiGe are especially prone to such defects, particularly if the Ge concentration is greater than 10%.

"Buried emitter," also known as "collector-up," bipolar transistor structures are known in the art wherein an emitter region is formed in or buried in a semiconductor substrate, while a collector region is formed at or over the top of the substrate. Among other recognized advantages, such devices tend to be highly immune to alpha particle and cosmic-ray induced disturbances.

U.S. Pat. No. 4,956,689 to Yuan et al. shows a collector-up, gallium arsenide, bipolar transistor wherein the emitter-base junction is defined within a bottom of a trench etched in a layered gallium arsenide structure. The base region is formed by implanting dopant into undoped portions of the layered gallium arsenide structure within the trench. The collector region is formed by growth of an epitaxial layer over the base region.

The structure of Yuan et al. is prone to the disadvantages of high collector-base capacitance, high extrinsic base resistance, and ion implantation defects within the base region.

A class of buried emitter devices well known in the art is that referred to as integrated injection logic (I2L). In I2L, a vertical NPN transistor is integrated with a lateral PNP transistor, such that the two transistors share common semiconductor regions. The vertical NPN is typically configured with a buried emitter. See, for example, U.S. Pat. No. 4,210,925 to Morcom et al.

With the art of semiconductor devices tending towards increased miniaturization and device density, it is highly desirable to provide compact, state-of-the-art transistor structures, and particularly those utilizing narrow base regions realizable by a repeatable, reliable process. It is further desirable if such structures and processes can accommodate buried emitter transistors, and the known advantages inherent therein.

OBJECTS OF THE INVENTION

An object of the present invention is to provide a new and improved transistor structure, incorporating a thin, epitaxially grown base region, and a method for making same.

Another object of the present invention is to provide such a method and structure capable of accommodating a buried-emitter type transistor, such as a bipolar transistor or a Schottky barrier collector transistor.

Another object of the present invention is to provide such a bipolar transistor wherein the emitter-base and base-collector junction areas are similar in size, so as to improve emitter efficiency and current gain, and to minimize base-collector capacitance.

A further object of the present invention is to provide such a transistor structure utilizing low-temperature processing steps so as to provide narrow base transistor regions.

Yet another object of the present invention is to provide such a transistor structure wherein a selected region can be readily formed of heterogeneous semiconductor materials, whereby to increase the speed and current gain of the transistor.

Yet another object of the present invention is to provide a transistor structure wherein all pn junctions are situated in single crystal semiconductor regions, thereby avoiding the formation of such junctions in polycrystalline semiconductor regions where leakage current due to grain boundaries may occur.

SUMMARY OF THE INVENTION

In accordance with one aspect of the present invention, there is provided a buried emitter semiconductor device comprising: a monocrystalline semiconductor substrate of a first conductivity type; a buried emitter region in the substrate; a first layer of monocrystalline semiconductor material over the device region; a layer of insulating material disposed over the first layer; a conductive contact disposed over a portion of the insulating material layer; the conductive contact, the first layer and the layer of insulating material together defining an aperture exposing a selected portion of the emitter region; and a second layer of semiconductor material of a second conductivity type in the aperture including a monocrystalline intrinsic base region portion disposed epitaxially over the selected emitter region portion and a polycrystalline extrinsic base region portion extending onto the wall of the conductive contact within the aperture. A buried-emitter bipolar transistor is completed by forming a semiconductor collector region of the first conductivity type epitaxially over the intrinsic base region. A buried-emitter Schottky Barrier Collector transistor is completed by forming a metal Schottky Barrier Collector contact over the intrinsic base region.

In accordance with another aspect of the present invention, there is provided a method of fabricating a semiconductor structure, comprising the steps of: providing a monocrystalline semiconductor device region of a first conductivity type; forming a first layer of intrinsic monocrystalline semiconductor material over the device region; forming a second layer of insulating material over the first layer; forming a conductive contact over a portion of the second layer; forming an aperture extending through the conductive contact, and the first and second layers to expose a selected portion of the device region; and forming a third layer of semiconductor material of a second conductivity type in the aperture including a monocrystalline portion disposed epitaxially over the selected device region portion and a polycrystalline portion extending onto the wall of the conductive contact within the aperture. A buried-emitter bipolar transistor is completed by forming a semiconductor collector region of the first conductivity type epitaxially over the monocrystalline portion of the third region (i.e. the intrinsic base region). The buried emitter is in the device region. A buried-emitter Schottky Barrier Collector transistor is completed by alternatively forming a metal Schottky Barrier Collector contact over the monocrystalline portion of the third region (i.e. the intrinsic base region). Similarly, the buried emitter is in the device region.

BRIEF DESCRIPTION OF THE DRAWINGS

These and other objects, features, and advantages of the present invention will become clear upon consideration of the following detailed description of the invention, when read in conjunction with the drawing Figures, in which.

DETAILED DESCRIPTION OF THE INVENTION

Figure 1:
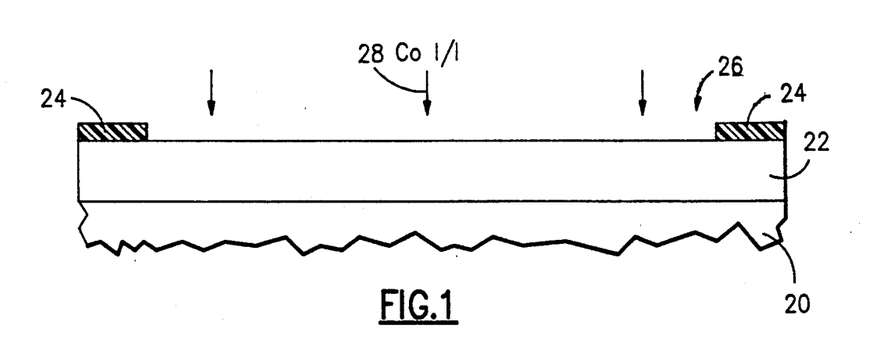
FIGS. 1–13 are cross-sectional views illustrating consecutive steps in the fabrication of a buried emitter, bipolar transistor in accordance with the present invention.

Referring now to the drawings, FIG. 1 shows a semiconductor structure including a P− silicon substrate 20 and an overlying N++ silicon epitaxial layer 22. Substrate 20 is formed, for example from a conventional crystal pull, to have a <100> crystal orientation, and a resistivity in the range of 10–25 ohm/cm. Epitaxial layer 22 is formed by a conventional, epitaxial, chemical vapor deposition (CVD) process, to a thickness of about 2 microns. Epitaxial layer 22 can be grown in situ doped, or doped by ion implantation subsequent to its formation.

As used herein, ∓N" and "P" designate dopant types, while "+" and "−" designate relative doping concentrations.

Figure 2:
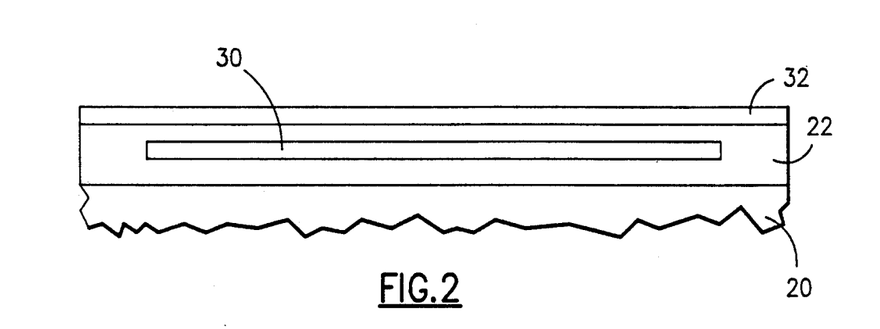

A conventional photoresist mask 24 is formed over the upper surface of epitaxial layer 22, and patterned to expose a region 26 of the epitaxial layer. Cobalt ions are implanted into region 26 of epitaxial layer 22 so as to subsequently form a buried cobalt silicide channel (channel 30 as shown in FIG. 2) in epitaxial layer 22. This cobalt ion implantation, represented diagrammatically by arrows 28 in FIG. 1, is shown and described in Van Ommen, et al., Applied Physics Letters, 53(8), Aug. 1988, pg. 669. As will become clear from the further description set out below, the formation of cobalt silicide channel 30 is for the purpose of improving emitter resistance, and is an optional part of the present invention. Photoresist mask 24 is removed in a conventional manner subsequent to this ion implantation.

Referring now to FIG. 2, the structure is subjected to a thermal anneal so as to form cobalt silicide channel 30. An intrinsic layer 32 of epitaxial silicon is then formed over the upper surface of layer 22. As used herein, the term "intrinsic" means undoped, i.e. with less than $10^{14}$ dopant atoms/cm$^3$. Epitaxial layer 32 is formed by a conventional CVD process to a thickness of about 1,000 Angstroms. As will be apparent from a consideration of the description continued below, intrinsic epitaxial layer 32 comprises a key feature of the invention, reducing the undesirable capacitance of the completed transistor device, and supporting various device junctions therein.

Figure 3:
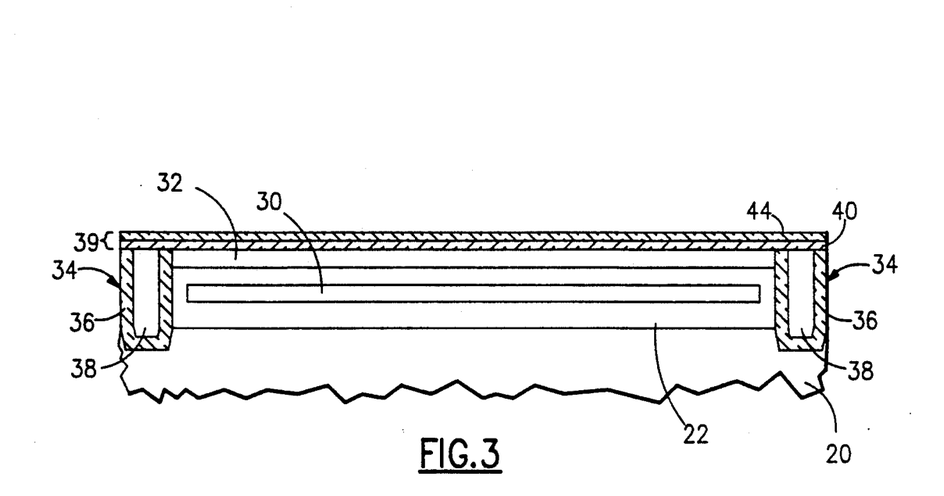

Referring now to FIG. 3, an isolation trench 34 is formed in the structure so as to extend from the upper surface of epitaxial layer 32 downward through epitaxial layer 22 and into substrate 20. As will become apparent from the FIGS. described below, trench 34 generally circumscribes a rectangular area of epitaxial layers 22 and 32. Trench 34 is formed in a conventional manner, beginning by masking and etching the trench aperture into the semiconductor structure. The opening for trench 34 is then lined with layer 36 of insulating material such as silicon dioxide. The lined trench 34 is then filled with polysilicon 38, or another suitable insulating material such as glass, and may further include a channel-stopping P+ region (not shown) at the trench bottom. The formation of trench 34 is completed by planarizing the structure to the upper surface of epitaxial layer 32, for example using a chemical-mechanical polish or an etch-back process.

It will be understood that, alternatively to the structure heretofor described, a multilayer P+ over P− substrate can be substituted for substrate 20, with isolation trench 34 extending into the P+ underlayer. No channel-stopping region would then be required.

Subsequent to the planarization of trench 34, a two layer stack 39 of insulating materials is formed conformally over the structure. Stack 39 includes a first layer 40 of thermally grown silicon dioxide formed directly on the structure to a thickness of about 500 Angstroms. To complete stack 39, a layer 44 of TEOS is deposited over silicon dioxide layer 40 by CVD and to a thickness of about 1,500 Angstroms.

Figure 4:
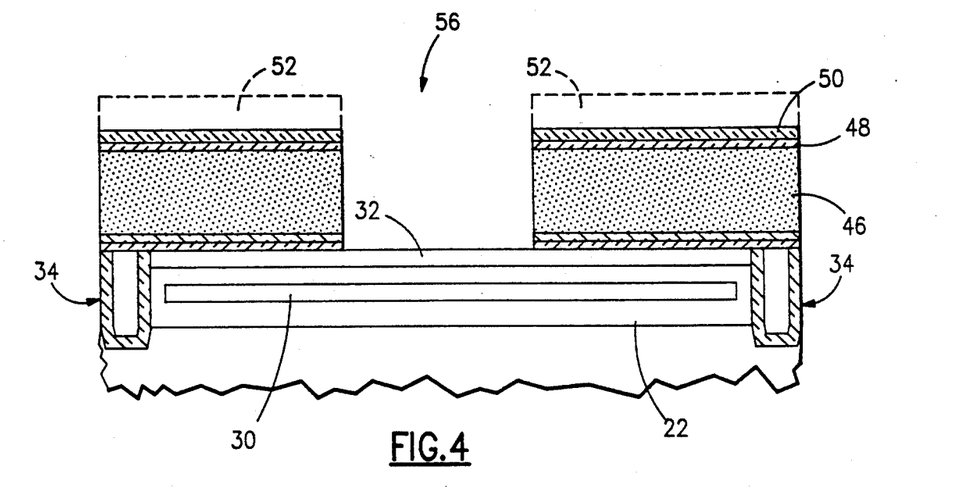

Referring now to FIG. 4, a layer 46 of polycrystalline silicon (polysilicon) is formed over TEOS layer 44 to a thickness of about 3,500 Angstroms. Polysilicon layer 46 is formed, for example, by CVD, and is in situ doped with boron ions to a P+ concentration. A layer 48 of silicon dioxide is grown over polysilicon layer 46, by thermal oxidation or CVD, to a thickness of about 500 Angstroms. A layer 50 of silicon nitride is grown over silicon dioxide layer 48, by a conventional process of plasma enhanced chemical vapor deposition (PECVD), to a thickness of about 1,500 Angstroms.

Still with reference to FIG. 4, a conventional photoresist mask, shown in dashed line at 52, is formed over silicon nitride layer 50, the mask being patterned in a conventional manner to include a generally rectangular aperture 56. Reactive ion etching (RIE) is then used to etch consecutively through layers 50, 48, 46, 44, and 40, and stop on epitaxial layer 32, thereby forming aperture 56. Appropriate etching plasmas for the RIE process include $CF_4/O_2$ for silicon dioxide and TEOS, $CF_4/CHF_3$ for silicon nitride, and $SF_6/Cl_2$ for polysilicon. As will become apparent from the description set out below, the exposed portion of epitaxial layer 32 in aperture 56 functions as the emitter region of a subsequently formed collector up transistor.

Figure 5:
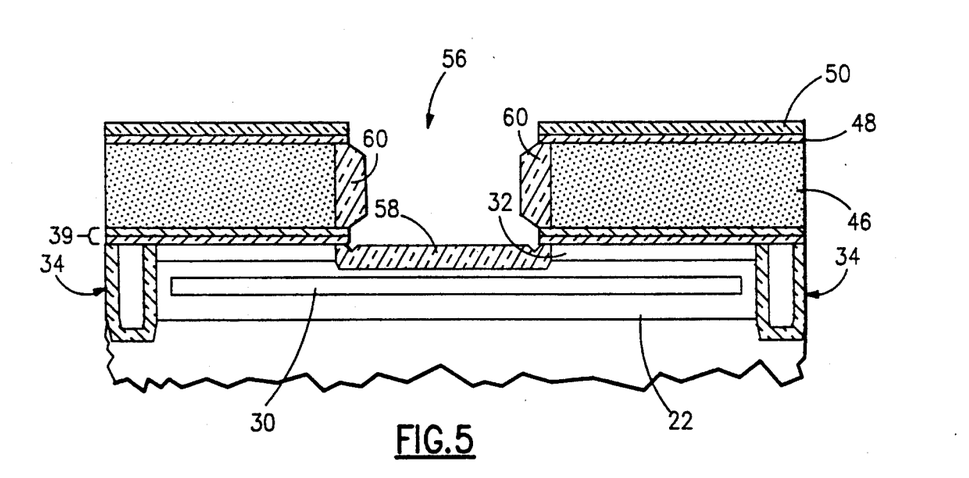

Referring now to FIG. 5, the structure is next exposed to a high pressure oxidation (HIPOX) process, for example a steam environment at 650 degrees centigrade and 10 atm pressure. This HIPOX process oxidizes exposed portions of layers 32 and 46 to form thermal oxide regions 58 and 60 on epitaxial layer 22 and polysilicon layer 46, respectively. Because of the higher dopant concentration of polysilicon layer 46 relative to epitaxial layer 22, oxide region 60 will form at approximately twice the rate (i.e. thickness) as oxide region 58. The HIPOX process is continued until oxide region 60 is approximately 4,000 Angstroms in lateral thickness. It is noted that oxide region 58 extends downward through layer 32 and into the top of layer 22 above region 30.

Figure 6:
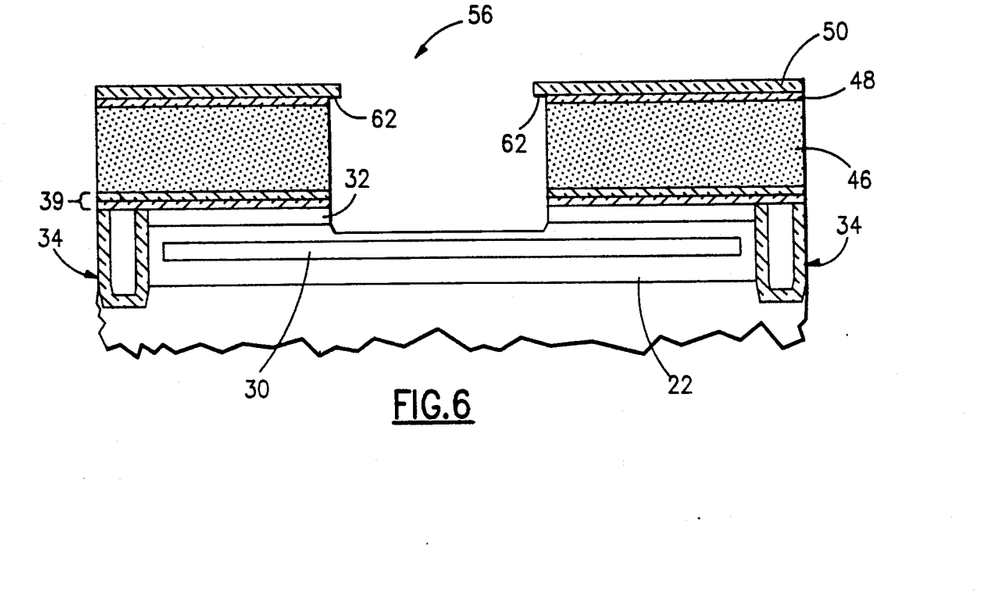

With reference now to FIG. 6, the structure is dipped in a BHF etchant to remove oxide regions 58 and 60, as well as the exposed silicon dioxide of layer 48 and stack 39. Because the BHF does not etch silicon nitride, layer 50 is left with approximately a 2,000 Angstrom overhang 62 into aperture 56.

Figure 7:
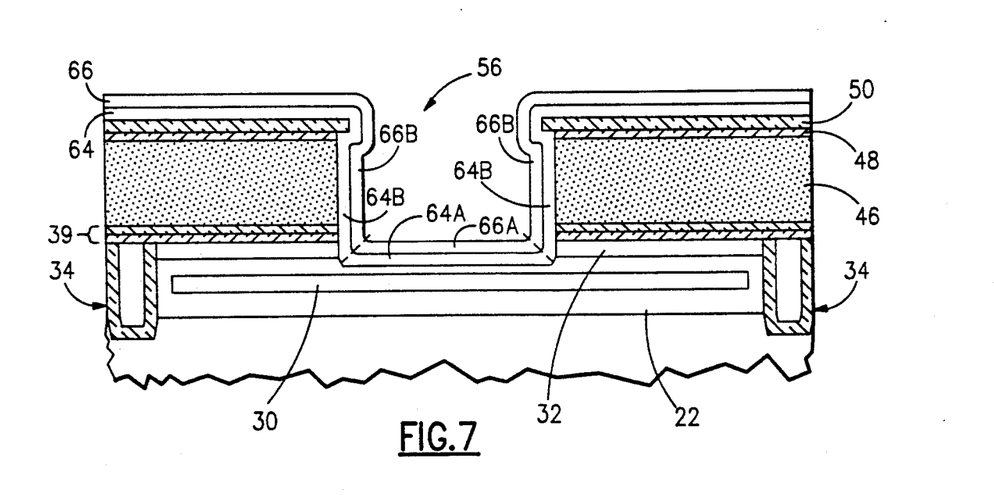

Referring now to FIG. 7, an 800 Angstrom thick, P type epitaxial layer 64 is formed conformally over the structure, including the vertical and horizontal surfaces defining aperture 56. Epitaxial layer 64 is formed in situ doped, with the dopant controlled so as to provide a peak concentration of about $3 \times 10^{18}$ atoms/cm$^3$ proximate the bottom of the layer, using a process of low-temperature epitaxy (LTE) as described in the article: "Low-temperature Silicon Epitaxy by Ultra-high Vacuum/Chemical Vapor Deposition", by B. S. Meyerson, Applied Physics Letter 48(12), 24 March 1986, pgs. 797-799. Epitaxial silicon layers formed by this process are known to possess very sharply defined doping profiles. Epitaxial layer 64 will be monocrystalline in structure in region 64A overlying epitaxial layer 22, and polycrystalline in structure in region 64B overlying the remainder of the structure. As will become apparent from the description below, regions 64A and 64B will function as the intrinsic and extrinsic base regions, respectively, of a subsequently formed transistor.

As an example, the above-described LTE process can comprise subjecting the structure to a gaseous mixture of $SiH_4/H_2$ and $B_2H_6$ (dopant source), in a flowing gaseous stream, at a temperature of less than about 700 degrees centigrade and a pressure of about $10^{-3}$ torr, for a time sufficient to achieve the desired thickness. Typically, such an ultra-high vacuum, chemical vapor deposition process is carried out at a temperature in the range of about 500–800 degrees centigrade, and a vacuum in the range of $10^{-2}-10^{-4}$ torr during deposition.

Further, it is well known in the art that the above-described LTE process, described with respect to the formation of a silicon layer 64, can also be used to deposit a silicon-germanium heterojunction layer through the introduction of germanium ions into the gaseous streams. Thus, layer 64 can be formed of silicon-germanium material, thereby providing a silicon-germanium heterojunction base region.

Continuing with reference to FIG. 7, a layer 66 of N type silicon is formed epitaxially over layer 64 to a thickness of about 1,700 Angstroms. Epitaxial layer 66 is formed by an LTE process substantially identical to that described above, with the substitution of a suitable dopant, such as phosphorous, to provide a relatively uniform doping of about $3 \times 10^{17}$ atoms/cm$^3$. Layer 66 will be monocrystalline in structure in region 66A overlying region 64A, and polycrystalline in structure in region 66B overlying region 64B. As will be described in detail below, region 66B will function as the collector region of a subsequently formed bipolar transistor.

Figure 8:
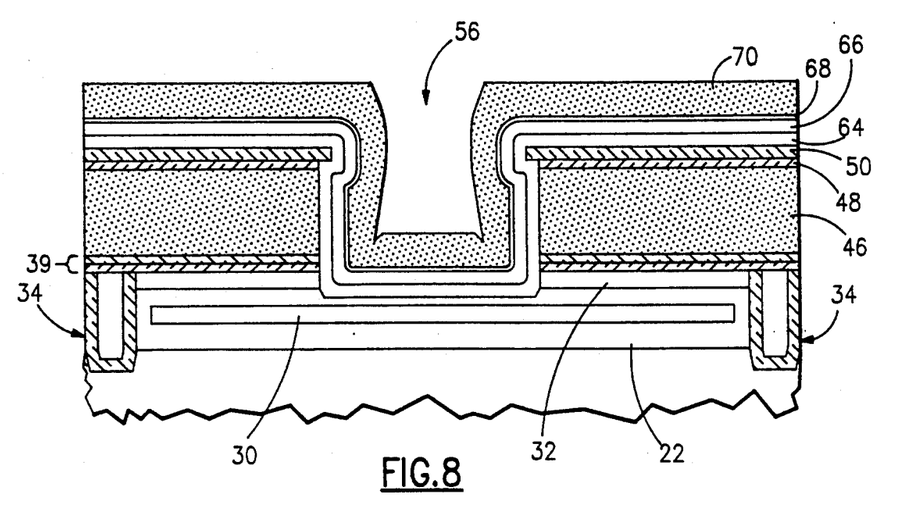

Referring now to FIG. 8, an insulator stack 68 is formed over epitaxial layer 66, the stack including a first, 500 Angstrom thick layer of HIPOX, and a second, 500 Angstrom thick layer of CVD-formed silicon nitride. (These layers are not separately illustrated to avoid cluttering the drawings.) A layer 70 of intrinsic polysilicon is formed conformally over insulator stack 68, by a conventional process of CVD, to a thickness of about 2,000 Angstroms.

Figure 9:
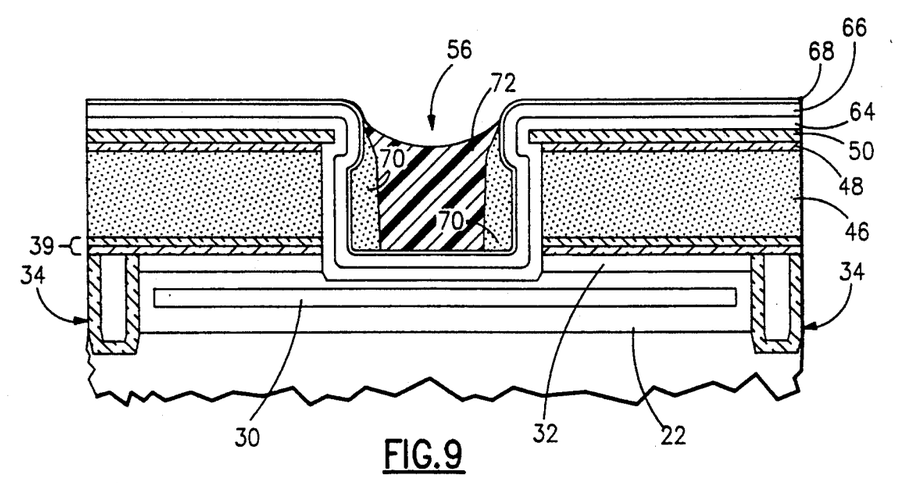

Referring now to FIG. 9, the structure is submitted to a RIE process, using $SF_6/Cl_2$ plasma, so as to anisotropically remove the horizontal portions of polysilicon layer 70, leaving a sidewall 70 on the vertical surface of insulator stack 68 within aperture 56. This RIE process stops on the top silicon nitride layer of insulator stack 68.

Still with reference to FIG. 9, the structure is conformally covered (not shown) with a spun on coating of photoresist to a thickness of about 1.5 micrometers. A RIE process with an $O_2$ plasma is used to etch back the photoresist to leave photoresist plug 72 in aperture 56.

Figure 10:
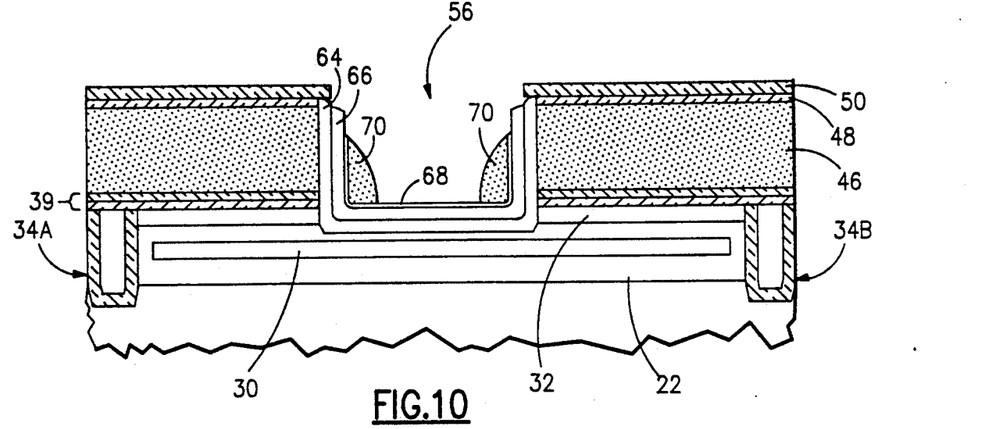

Referring now to FIG. 10, a RIE process with a $CF_4$ plasma is used to remove exposed portions of insulator stack 68. A RIE process with $SF_6/Cl_2$ plasma is next used to remove the exposed portions of layers 66 and 64. In accordance with a feature of the present invention, overhang 62 (see FIG. 6) of layer 50 functions to help protect the vertical regions 64B, 66B of layers 64 and 66, preventing their accidental etching. Photoresist plug 72 (FIG. 9) is then removed in a conventional manner, for example by oxygen ashing.

Figure 11:
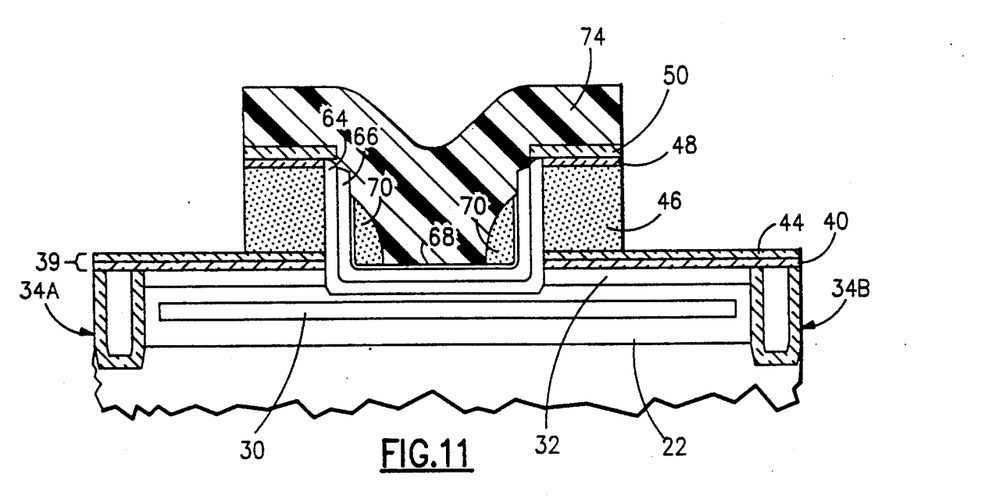

With reference now to FIG. 11, a layer of photoresist material is formed and patterned in a conventional manner so as to leave a mask 74 covering aperture 56 and extending a lateral distance beyond the aperture. The lateral distance of mask 74 will be used to define the extrinsic base region of a subsequently formed bipolar transistor.

With mask 74 in place, appropriate RIE processes are used to consecutively remove the unmasked portions of silicon nitride layer 50, silicon dioxide layer 48, and polysilicon layer 46, stopping on TEOS layer 44. Mask 74 is stripped in a conventional manner.

Figure 12:
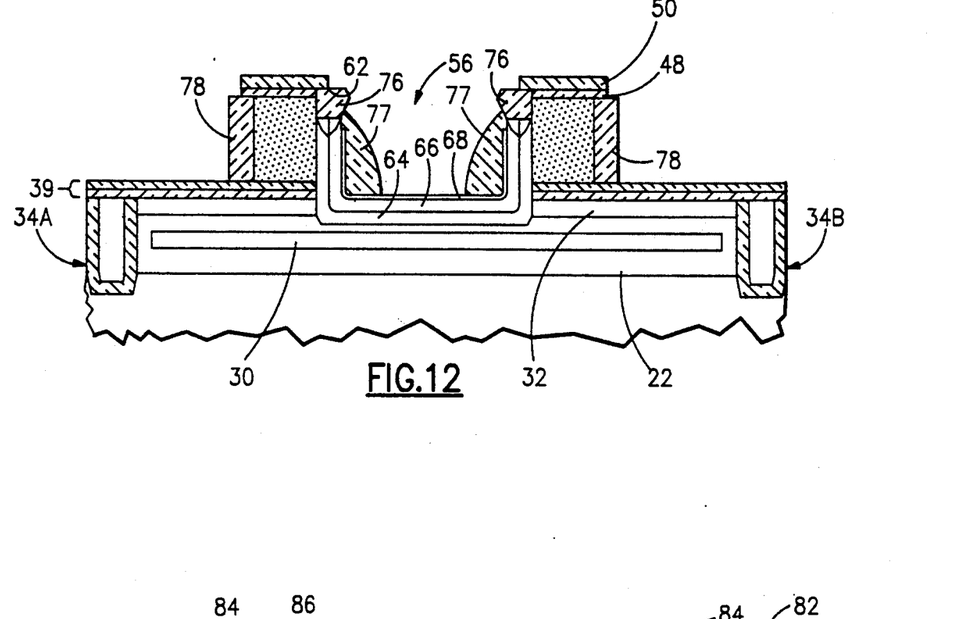

Referring now to FIG. 12, the device is subjected to a HIPOX process as described above, so as to form silicon dioxide lip 76 within aperture 56 between nitride lip 62 and sidewall 70. This same HIPOX process simultaneously converts sidewall 70 to silicon dioxide 77, and forms silicon dioxide layer 78 over the outer, vertical surface of polysilicon layer 46. The process is continued until silicon dioxide layer 78 reaches a thickness of approximately 2,000 Angstroms.

Figure 13:
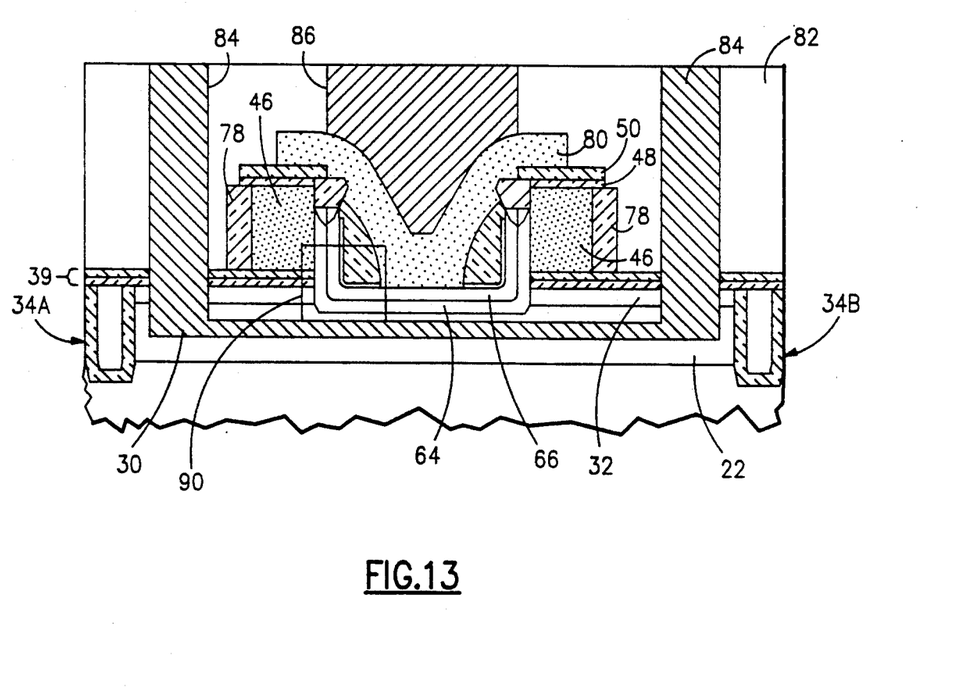

Referring now to FIG. 13, an appropriate RIE process is used to remove the exposed portion of insulator stack 68 within aperture 56. The thusly exposed surface of epitaxial layer 66 is subjected to a BHF clean.

In a conventional, emitter-up, vertical bipolar transistor, RIE etch damage to the emitter region can have a serious detrimental effect on the operation of the transistor. In accordance with an advantage of the present invention, any damage to the surface of the collector region caused by the above-described etching step does not have as detrimental an effect on the transistor because this region is not as critical as the emitter region. The BHF clean, however, is still desirable.

Still with reference to FIG. 13, a layer of N+, in situ doped polysilicon is deposited conformally over the device (not shown), and patterned with conventional photoresist masking and etching processes to leave collector contact 80. The polysilicon layer forming contact 80 is preferably formed by a conventional CVD process to a thickness of about 1,500 Angstroms. Subject to the formation of collector contact 80, the device is subject to a relatively low-temperature, activating anneal, for example at 800 degrees centigrade for 20 minutes. As a result of outdiffusion from emitter layer 22, the intrinsic layer 32 is converted into an N-type region.

At this point it will be appreciated that there is formed a completed, collector-up, bipolar transistor comprised of: an emitter region in epitaxial layer 22 over channel 30, an intrinsic base region generally in layer region 64A, and a collector region generally in layer region 66A. Buried silicide channel 30 forms a contact to the emitter region in layer 22. The extrinsic base region is comprised of polysilicon regions 64B, 66B and electrically linked, polysilicon layer 46. Contact is made to collector region 66A through polysilicon collector contact 80.

Figure 14:
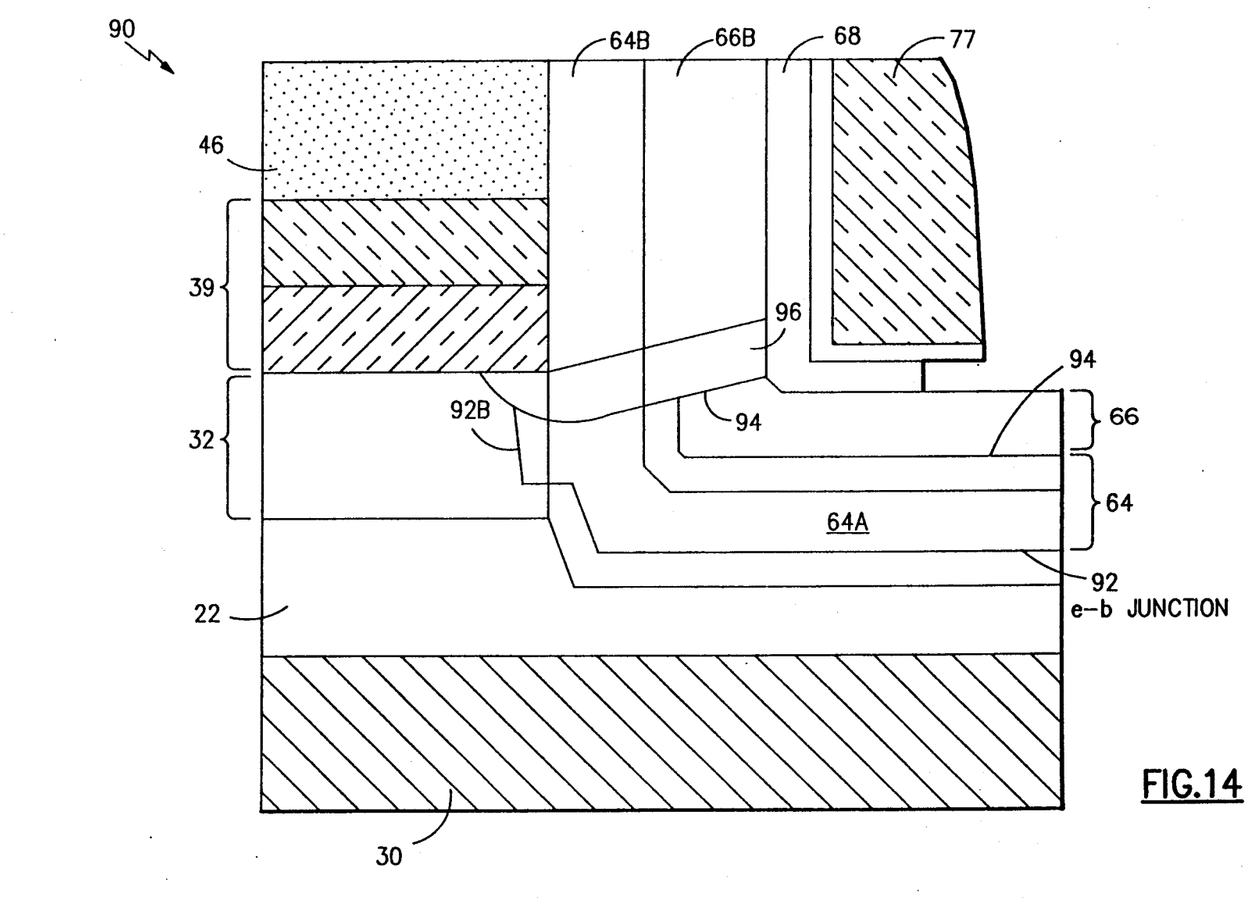
FIG. 14 is an enlarged portion of FIG. 13 showing details of the various bipolar transistor junctions therein.

Referring now to FIG. 14, an enlarged view of a region 90 from FIG. 13 is shown to better illustrate the details of the transistor junctions and electrical linkages. More specifically, an emitter/base junction 92A is situated in epitaxial layer 64 as a result of out-diffusion from emitter layer 22 into the intrinsic base region. This emitter-base junction is also seen to extend, as shown at 92B, into epitaxial layer 32.

Continuing to describe FIG. 14, a base/collector junction 94 is situated in epitaxial layer 66, dopant from epitaxial layer 64 having out-diffused into the overlying intrinsic collector region in layer 66. Extrinsic base polysilicon 46 is electrically linked with regions 64B and 66B as a result of out-diffusion of P type dopants from the contact into the region. A "sliver" shaped region 96 is the outdiffusion of P-type dopants from polycrystalline regions 64B and 66B. Junction 97 represents the transition from polysilicon to monocrystalline silicon.

Figure 15:
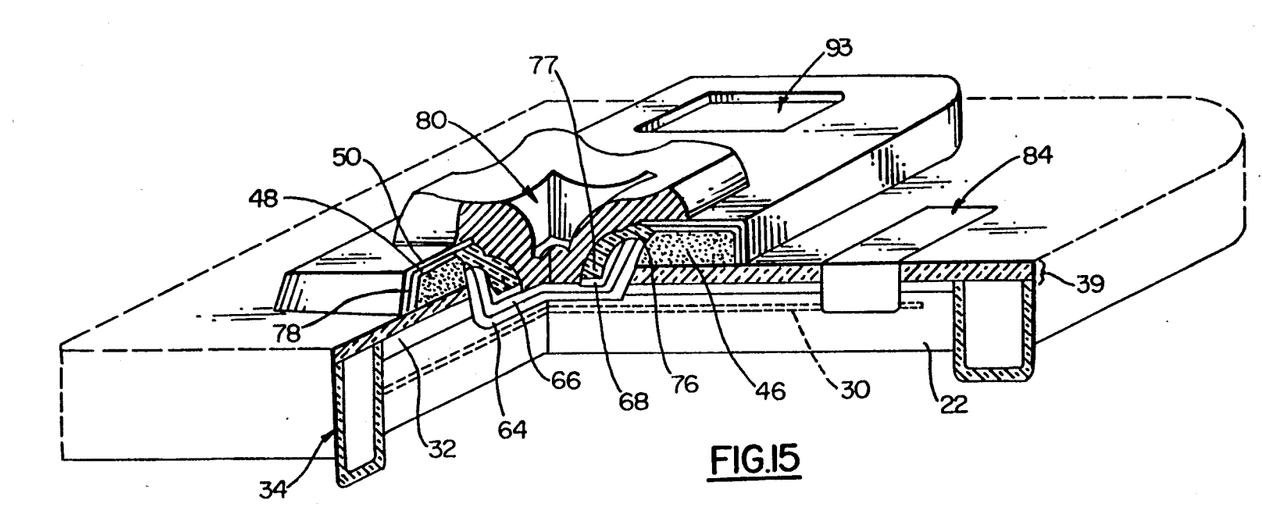
FIG. 15 is a perspective view, partly in cross-section, of FIG. 14.

Referring again to FIG. 13, and additionally to FIG. 15, a layer of planarized quartz 82 (not shown in FIG. 15) is deposited over the upper surface of the structure, and tungsten studs 84 and 86 not visible in FIG. 15) formed to silicide channel 30 and collector contact 80, respectively. As can best be appreciated from FIG. 15, isolation trench 34 circumscribes a generally rectangular region within layers 30, 32, and 22 isolating the transistor from other, adjoining devices (not shown). The remaining portions of the base and collector layers 64 and 66, as well as collector contact 80, are generally rectangular in shape. Visible only in FIG. 15 is a laterally displaced, metal contact 93 to extrinsic base region 46.

In accordance with one embodiment of the present invention, there is thus provided a buried-emitter bipolar transistor including epitaxially deposited base and collector regions. The transistor structure includes similar emitter-base and base-collector junction areas, resulting in near zero collector-substrate capacitance, and lower base-collector capacitance than that typically found in prior-art, buried collector devices. The inclusion of intrinsic epitaxial layer 32 serves two purposes. First, the layer functions as a buffer zone, preventing emitter region 22 from directly contacting or overlapping base out-diffusion region 96, thereby avoiding a nigh reverse leakage current. Epitaxial layer 32 further functions as a seeding layer for the growth of single crystal, LTE base region 64A. Without layer 32, the quality of junction 92B would be degraded due to polycrystalline grain boundary leakage.

The method of forming the transistor utilizes high-temperature steps early in the process, with lower-temperature steps towards the end of the process, thereby providing the advantages of: 1) incorporating higher dopant into the emitter area, improving the emitter injection efficiency, 2) accommodating the inclusion of a heterojunction base region, and 3) avoiding high temperature defect propogation of the type described in the Background of the Invention, above. The entire process is self-aligned.

In accordance with another embodiment of the present invention, the structure shown and described above can be connected and utilized as a conventional, emitter-up bipolar transistor. With reference to FIG. 7, such an emitter up structure is obtained by depositing layer 66 underneath of layer 64. Layer 64 is formed such that the dopant concentration is higher proximate its upper surface. The process steps shown and described with respect to FIGS. 8-13 are otherwise followed identically.

Figure 16:
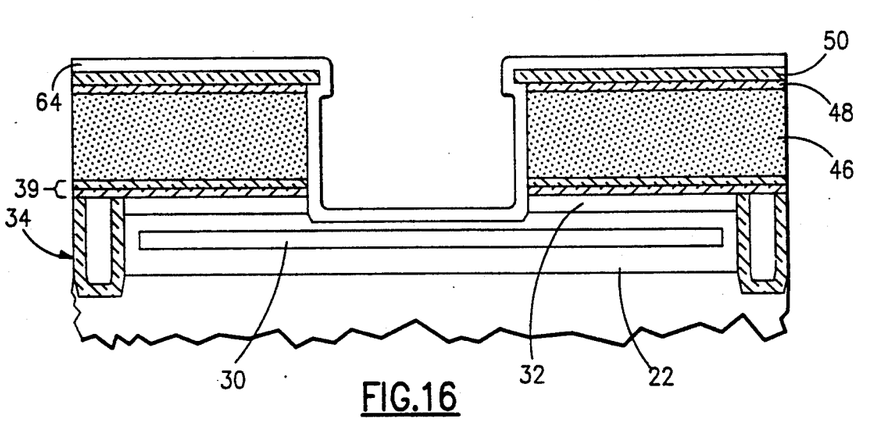
FIGS. 16 and 17 show alternate steps to those shown in FIGS. 7 and 12, whereby to fabricate an SBC transistor.
Figure 17:
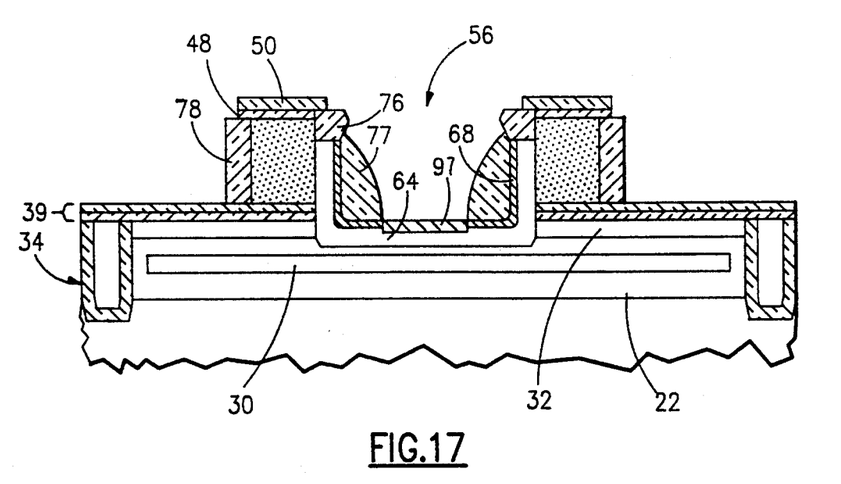

Referring now to FIGS. 16 and 17, yet another embodiment of the invention is shown wherein a buried-emitter, Schottky Barrier Collector (SBC) transistor is formed. FIG. 16 shows an alternate step to that of FIG. 7, while FIG. 17 shows an alternate step to that of FIG. 12.

In accordance with this embodiment of the invention, and as is shown in FIG. 16, epitaxial layer 66 (FIG. 7) is not formed. The process is otherwise identical to that shown in FIGS. 1 through 7.

Subsequent to the formation of layer 64 as shown in FIG. 16, the process steps described with respect to FIGS. 8-11 are followed identically.

Referring now to FIG. 17, subsequent to the etching away of exposed insulating layer 68 in the bottom of aperture 56, a metal SBC contact 97 is formed, for example of hafnium. The device is then completed essentially as shown and described with respect to FIGS. 13 and 15.

There is thus formed, using essentially the identical process steps with the minor changes described above, a buried-emitter, SBC transistor. This transistor has the advantages of near zero storage time, near zero collector series resistance, and near zero collector transit time. The resulting transistor can be utilized without concern about device saturation.

There is thus provided a semiconductor structure including an epitaxially deposited, active device region. The process used to form the structure can be readily altered, as described above, to provide 1) a buried-emitter bipolar transistor, 2) a buried emitter, heterojunction base, bipolar transistor, 3) a buried-emitter, SBC transistor, or 4) a conventional, emitter-up bipolar transistor. The various transistors are all high-performance devices, exhibiting the variously ascribed advantages described in detail hereinabove. The invention has application in the manufacture of semiconductor devices, and particularly in the manufacture of very large scale integrated (VLSI) circuits.

While the invention has been shown and described with respect to preferred embodiments, it is not thus limited. Numerous modifications, changes, and improvements will occur to those skilled in the art which fall within the spirit and scope of the present invention.

What is claimed is:

1. A buried emitter bipolar transistor comprising:
   a monocrystalline semiconductor substrate of a first conductivity type;
   a buried emitter region of a second conductivity type in said substrate;
   a first layer of monocrystalline intrinsic semiconductor material in direct contact with said buried emitter region;
   a layer of insulating material in direct contact with said first layer;
   a conductive contact in direct contact with a portion of said layer of insulating material;
   said conductive contact, said first layer and said layer of insulating material together defining an aperture exposing a selected portion of said emitter region;
   a second layer of semiconductor material of said second conductivity type in said aperture including a monocrystalline intrinsic base region having silicon-germanium therein disposed epitaxially over and in direct contact with said selected emitter region portion and a polycrystalline extrinsic base region portion extending onto the wall of said conductive contact within said aperture and in direct contact with said intrinsic base region; and
   a collector region in direct contact with said intrinsic base region, said collector region including a third layer of semiconductor material of said first conductivity type formed epitaxially over said intrinsic base region.

2. A buried emitter bipolar transistor comprising:
   a monocrystalline semiconductor substrate of a first conductivity type;
   a buried emitter region of a second conductivity type in said substrate;
   a first layer of monocrystalline intrinsic semiconductor material in direct contact with said buried emitter region;
   a layer of insulating material in direct contact with said first layer;
   a conductive contact in direct contact with a portion of said layer of insulating material;
   said conductive contact, said first layer and said layer of insulating material together defining an aperture exposing a selected portion of said emitter region;
   a second layer of semiconductor material of said second conductivity type in said aperture including a monocrystalline intrinsic base region disposed epitaxially over and in direct contact with said selected emitter region portion and a polycrystalline extrinsic base region portion extending onto the wall of said conductive contact within said aperture and in direct contact with said intrinsic base region; and
   a collector region in direct contact with said intrinsic base region, said collector region including a third layer of semiconductor material of said first conductivity type formed epitaxially over said intrinsic base region and a polycrystalline extension extending over and insulated from said extrinsic base region.

3. A bipolar transistor in accordance with claim 2 and further including:
   an insulating spacer disposed on the surface of said polycrystalline extension of said collector region; and
   a conductive collector contact extending over said insulating spacer and into electrical contact with said collector region.

4. A bipolar transistor in accordance with claim 2 and further including a layer of insulating material over said conductive contact and including a protective lip extending over exposed upper edges of said extrinsic base region and said polycrystalline extension of said collector region.

5. A buried emitter bipolar transistor comprising:
   a monocrystalline semiconductor substrate of a first conductivity type;
   a buried emitter region of a second conductivity type in said substrate;
   a buried silicide layer in said substrate underneath said buried emitter region;
   a first layer of monocrystalline intrinsic semiconductor material in direct contact with said buried emitter region;
   a layer of insulating material in direct contact with said first layer;

a conductive contact in direct contact with a portion of said layer of insulating material;

said conductive contact, said first layer and said layer of insulating material together defining an aperture exposing a selected portion of said emitter region;

a second layer of semiconductor material of said second conductivity type in said aperture including a monocrystalline intrinsic base region disposed epitaxially over and in direct contact with said selected emitter region portion and a polycrystalline extrinsic base region portion extending onto the wall of said conductive contact within said aperture and in direct contact with said intrinsic base region; and a collector region in direct contact with said intrinsic base region, said collector region including a third layer of semiconductor material of said first conductivity type formed epitaxially over said intrinsic base region.

6. A bipolar transistor in accordance with claim 5 and further including at least one conductive emitter contact spaced from said conductive contact and extending into electrical contact with said silicide layer.

7. A buried emitter Schottky Barrier Collector transistor comprising:

a monocrystalline semiconductor substrate of a first conductivity type;

a buried emitter region of a second conductivity type in said substrate;

a first layer of monocrystalline intrinsic semiconductor material in direct contact with said buried emitter region;

a layer of insulating material in direct contact with said first layer;

a conductive contact in direct contact with a portion of said layer of insulating material;

said conductive contact, said first layer and said layers of insulating material together defining an aperture exposing a selected portion of said emitter region;

a second layer of semiconductor material of said second conductivity type in said aperture including a monocrystalline intrinsic base region disposed epitaxially over and in direct contact with said selected emitter region portion and a polycrystalline extrinsic base region portion extending onto the wall of said conductive contact within said aperture and in direct contact with said intrinsic base region; and a collector region in direct contact with said intrinsic base region, said collector region including a metal Schottky Barrier Collector contact on said intrinsic base region.

8. A Schottky Barrier Collector transistor in accordance with claim 7 and further including a buried silicide layer in said substrate underneath said emitter region.

9. A Schottky Barrier Collector transistor in accordance with claim 8 and further including at least one conductive emitter contact spaced from said conductive contact and extending into electrical contact with said silicide layer.

* * * * *